(12) United States Patent
Kamgaing et al.

(10) Patent No.: US 10,327,268 B2
(45) Date of Patent: Jun. 18, 2019

(54) MICROELECTRONIC PACKAGE WITH WIRELESS INTERCONNECT

(71) Applicant: Intel Corporation, Santa Clara, CA (US)

(72) Inventors: Telesphor Kamgaing, Chandler, AZ (US); Adel A. Elsherbini, Chandler, AZ (US); Emanuel Cohen, Zichron Yaacov (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/745,908

(22) PCT Filed: Sep. 25, 2015

(86) PCT No.: PCT/US2015/052463
§ 371 (c)(1),
(2) Date: Jan. 18, 2018

(87) PCT Pub. No.: WO2017/052648
PCT Pub. Date: Mar. 30, 2017

(65) Prior Publication Data
US 2018/0212645 A1    Jul. 26, 2018

(51) Int. Cl.
*H01Q 9/16*         (2006.01)
*H04W 76/10*        (2018.01)
(Continued)

(52) U.S. Cl.
CPC ............. *H04W 76/10* (2018.02); *H01L 23/66* (2013.01); *H01L 24/17* (2013.01);
(Continued)

(58) Field of Classification Search
CPC ..... H01L 23/66; H01L 24/17; H01L 25/0655; H01L 2223/6677; H01L 2223/6683;
(Continued)

(56) References Cited

U.S. PATENT DOCUMENTS

| 7,595,766 B2 * | 9/2009 | Rofougaran | ......... | H01Q 1/2283 |
| | | | | 343/795 |
| 2005/0098612 A1 * | 5/2005 | Six | .......... | H01L 23/20 |
| | | | | 228/180.22 |

(Continued)

FOREIGN PATENT DOCUMENTS

| KR | 10-2004-0027930 | 4/2004 |
| KR | 101412946 | 6/2014 |
| WO | WO-2012040376 | 3/2012 |

OTHER PUBLICATIONS

International Preliminary Report on Patentability for PCT/US2015/052463, dated Apr. 5, 2018, 11 pages.
(Continued)

*Primary Examiner* — Sonny Trinh
(74) *Attorney, Agent, or Firm* — Schwabe, Williamson & Wyatt, P.C.

(57) ABSTRACT

A microelectronic package is described with a wireless interconnect for chip-to-chip communication. In one example, the package includes an integrated circuit chip, a package substrate to carry the integrated circuit chip, the package substrate having conductive connectors to connect the integrated circuit chip to external components, a radio coupled to the integrated circuit chip to receive data from the integrated circuit chip and modulate the data onto a radio frequency carrier, and an antenna on the package substrate coupled to the radio to send the modulated data over the carrier to an external device.

18 Claims, 7 Drawing Sheets

(51) Int. Cl.
  H01L 23/66      (2006.01)
  H01L 25/065     (2006.01)
  H01L 25/16      (2006.01)
  H01Q 1/22       (2006.01)
  H04B 1/48       (2006.01)
  H01L 23/00      (2006.01)
  H04Q 1/02       (2006.01)
  H05K 7/14       (2006.01)
  H01Q 3/30       (2006.01)
  H04B 1/38       (2015.01)

(52) U.S. Cl.
  CPC ...... *H01L 25/0655* (2013.01); *H01L 25/0657* (2013.01); *H01L 25/16* (2013.01); *H01Q 1/2266* (2013.01); *H01Q 1/2283* (2013.01); *H04B 1/48* (2013.01); *H04Q 1/15* (2013.01); *H05K 7/1487* (2013.01); *H01L 24/16* (2013.01); *H01L 24/73* (2013.01); *H01L 2223/6616* (2013.01); *H01L 2223/6677* (2013.01); *H01L 2223/6683* (2013.01); *H01L 2223/6688* (2013.01); *H01L 2224/16221* (2013.01); *H01L 2224/16235* (2013.01); *H01L 2224/73253* (2013.01); *H01L 2225/0652* (2013.01); *H01L 2225/06517* (2013.01); *H01L 2225/06548* (2013.01); *H01L 2225/06572* (2013.01); *H01L 2225/06589* (2013.01); *H01L 2924/1033* (2013.01); *H01L 2924/10253* (2013.01); *H01L 2924/10329* (2013.01); *H01L 2924/1421* (2013.01); *H01L 2924/1432* (2013.01); *H01L 2924/1434* (2013.01); *H01L 2924/15153* (2013.01); *H01L 2924/15192* (2013.01); *H01L 2924/15311* (2013.01); *H01L 2924/15313* (2013.01); *H01L 2924/15321* (2013.01); *H01L 2924/19105* (2013.01); *H01Q 3/30* (2013.01); *H04B 1/38* (2013.01)

(58) Field of Classification Search
  CPC ... H04W 76/10; H01Q 1/2266; H01Q 1/2283; H04B 1/48
  USPC ....... 343/820, 795, 753, 835, 846, 720, 702, 343/700 MS
  See application file for complete search history.

(56) References Cited

U.S. PATENT DOCUMENTS

2009/0016417 A1    1/2009  Rofougaran
2012/0249388 A1*  10/2012  Hansen ............... H01Q 1/2266
                                              343/753
2012/0325915 A1*  12/2012  Kato .................. H01Q 1/2225
                                              235/492
2014/0176368 A1    6/2014  Kamgaing et al.

OTHER PUBLICATIONS

International Search Report and Written Opinion for International Patent Application No. PCT/US2015/052463 dated Jul. 11, 2016, 15 pgs.

* cited by examiner

MICROELECTRONIC PACKAGE WITH WIRELESS INTERCONNECT

CROSS-REFERENCE TO RELATED APPLICATION

This patent application is a U.S. National Phase Application under 35 U.S.C. § 371 of International Application No. PCT/US2015/052463, filed Sep. 25, 2015, entitled "MICROELECTRONIC PACKAGE WITH WIRELESS INTERCONNECT," which designates the United States of America, the entire disclosure of which is hereby incorporated by reference in its entirety and for all purposes.

FIELD

The present description relates to communication between devices in a computing system and, in particular, to wireless communication using antennas on an integrated circuit package.

BACKGROUND

In many computer systems multiple integrated circuit chips communicate with each other to perform the programmed operations. The different chips may include central processing units, high speed memories, mass storage devices, chipsets, video processors, and input/output interfaces. Some computers may have more than one of each of these kinds of chips. The chips are traditionally mounted to a motherboard or system board either directly or through a socket or a daughter card.

The chips traditionally communicate using copper interconnects or links that travel through the chip's package vias, through the socket, through the platform motherboard and then back through the socket and package of the next chip. In another variation, a flexible connector cable is connected directly between two different packages to bypass the socket and the platform motherboard. This provides a more direct path with fewer interfaces through different connections.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

As described herein, a flexible radio frequency interconnect provides point-to-point or single point to multiple point data communication. It may be used as the only data interface or as a supplement to cable or copper interconnect technologies. Some connections may be moved to a radio interface to lessen the complexity of the socket. This may also improve signal fidelity by avoiding losses in an electrical connection.

A wireless interconnect may be built on the package of a chip to provide over the air transmission between two different microelectronic chips at very high data rates. The wireless interconnect may be driven at millimeter wave (mm-wave) or sub-Terahertz (sub-THz) frequencies, where the antennas may be made extremely small to fit on the package of a small microelectronic chip. In addition, the fractional bandwidth may be made very large to allow very high data rates with simple and low power modulation schemes.

Figure 1:
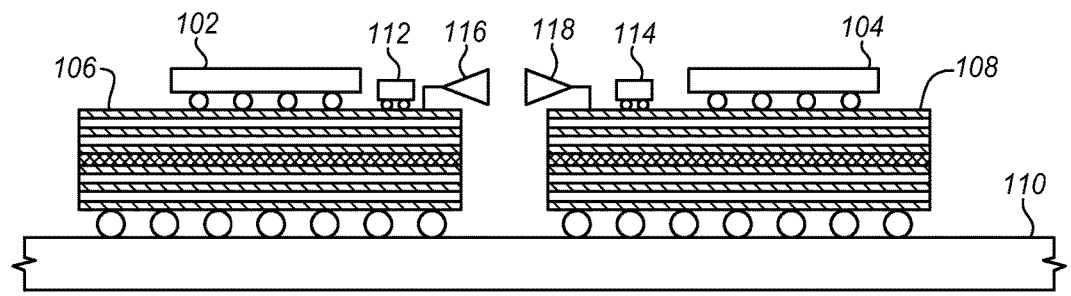
FIG. 1 is a side view cross-sectional diagram of a wireless interconnect for chip-to-chip communications according to an embodiment.

FIG. 1 is a general side view cross-sectional diagram of one example of a wireless interconnect using antennas for chip to chip communication or for free space optics. A first 102 and second 104 chip are each mounted to a respective package 106, 108 using a ball grid array (BGA), land grid array (LGA), or other connection system including pads, wire leads, or other connectors. The packages are mounted to a printed circuit board (PCB) 110, such as a motherboard, system or logic board or daughter card using a solder ball array or any other desired system. The packages 106, 108 are electrically connected to external components, power, and any other desired devices through traces (not shown) on or in the PCB. The chips may also be connected to each other through the PCB. The packages may be mounted to the PCB using sockets (not shown), depending on the particular implementation.

The first and second chip 102, 104 are discussed herein as being central processing units and, in particular, as server CPUs. However, the techniques and configurations described herein may be applied to many different types of chips for which a high speed communications link would be suitable. In some implementations, the chip may include many different functions such as with a SoC (System on a Chip). In other implementations, the chips may be memory, a communications interface hub, a storage device, co-processor or any other desired type of chip. In addition, the two chips may be different so that one may be a CPU and the other may be a memory or a chipset, for example.

Each chip is also connected through the package to a respective radio 112, 114. The radio may be formed of a single die or a package with multiple dies or using another technique. Each radio is mounted to the package near the edge of the package that is near to the other chip. The package may include copper traces, lines, or layers to connect particular lands, pads, or solder balls of the chip to the radio die for data and control signals. The radio die may also be connected to the chip to provide power to the radio die. Alternatively, the radio die may obtain power from an external source through the package connection to the PCB.

An antenna 116, 118 is also mounted to the package and coupled to the radio. Extremely small antennas may be used that are integrated onto or into the package substrate. The antennas are configured so that when the packages are mounted to the PCB, the antennas are directed to each other. The short distance between the antennas allow for a low power and low noise connection between the two chips. The wireless interconnect reduces the complexity of the socket and the complexity of the motherboard for the computing platform.

While different frequencies may be used to suit particular implementations. Millimeter wave and sub-THz frequencies allow for an antenna that is small enough to be integrated on the same package that is normally used for the chip. The antennas may also be constructed using the same materials that are used in the fabrication of the package substrate and still exhibit good electrical performance.

In some embodiments, a server may be constructed with multiple CPUs. Each CPU may be mounted to a package with multiple parallel radio die and antenna sets to provide multiple parallel channels within the server between two CPUs. A small antenna size permitted for millimeter-wave signals allows each antenna of the package for one of the CPUs to be directed to a corresponding antenna on the package for the other CPU. This configuration may be used to combine parallel radio connections and provide Terabit per second data rates.

In some embodiments, a broadband wireless interconnect may be used. For example with a radio operating in a radio frequency range of from 100-140 GHz, the size of each antenna including the keep out zone can be as small as 1.25×1.25 mm to 2.5×2.5 mm. The actual antenna may be still smaller. Considering a typical server CPU package, more than 30 antennas of 1.25×1.25 mm may be placed along one edge of the package. This would allow more than 30 separate links each carrying 40-80 Gb/s each over a short distance. The separate links may all be used to communicate with a single second chip as shown in FIG. 1 or there may be different package antennas placed next to different antennas of the CPU package. This allows the CPU package to communicate with different chips using different links.

In addition to the simple point-to-point connection of FIG. 1, point-to-multi-point transmission may also be provided without using an external switch matrix. The antennas of multiple chip packages may be positioned within range of the antenna or antennas of one of the CPU packages. The multiple chip packages may all receive the same signal from the CPU package at the same time. In order to control which of the multiple chip package receive a transmission, the radio and antenna system may include beam steering.

Figure 2:
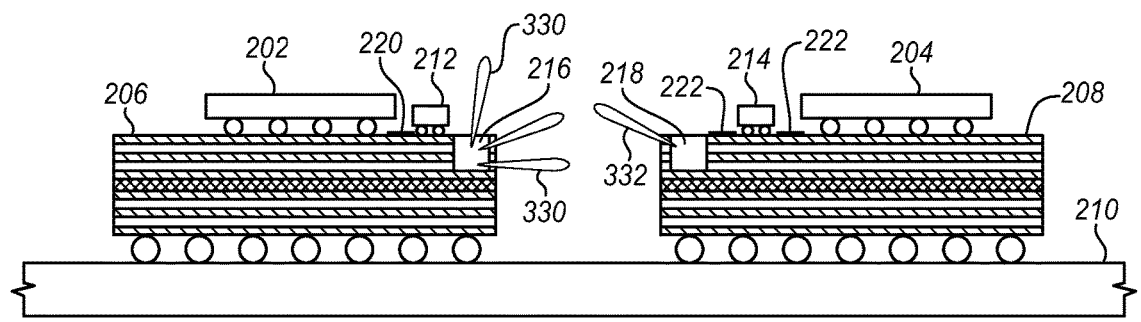
FIG. 2 is a side view cross-sectional diagram of an alternative wireless interconnect for chip-to-chip communications according to an embodiment.

FIG. 2 is a side view cross-sectional diagram of an alternative configuration of a wireless interconnect. As shown a first 202 and a second 204 chip are mounted to respective package substrates 206, 208 which are each mounted to a motherboard 210. Each chip is connected to a respective radio die 212, 214 through its respective package 206, 208. Each radio die 212, 214 is connected to a respective antenna 216, 218. The antennas are positioned to provide a clear and direct wireless connection.

The packaged system may take any of a variety of different forms. One or both of the packages may be a microelectronic module that contains a system on a chip (SoC) or CPU die 202, 204, a millimeter-wave or sub-THz transceiver chip (radio) 212, 214 and an on-package integrated antenna 216, 218. Additional dies and other supporting components such as passives and connectors may also be assembled on the package substrate 206, 208. A SoC die is typically designed and implemented on a low resistivity digital silicon and may also include typical functions found in the baseband portion of a wireless module. If the transceiver or radio die is implemented as a separate die, as shown, then it may be implemented in a high resistivity silicon or on any other type of RF semiconductor substrate including Gallium Arsenide, Gallium Nitride and certain polymers. Alternatively, the radio 212 may be implemented on the primary die 202. A low loss package material processed to have low surface roughness may be used for the package 206 to provide superior electrical performance in the millimeter-wave and sub-THz frequency range. The package materials may include liquid crystal polymers and its derivatives, prepreg (pre-impregnated fiberglass resin and epoxy), BT (bismaleimide triazine resin epoxy) laminates, other organic substrates, glass, silicon or ceramic.

The wireless interconnect system includes the transceiver chip 206, the on-package antenna 216, 218 and on-package routing 220, 222 to connect the transceiver chip to the main chip and to the antenna. The wireless transmission also uses a wireless receiver on the other package. The receiver system may be a mirror image of the transmitter. For bidirectional transmission, the millimeter-wave/sub-THz transceiver may have both transmit and receive chains.

Figure 3:
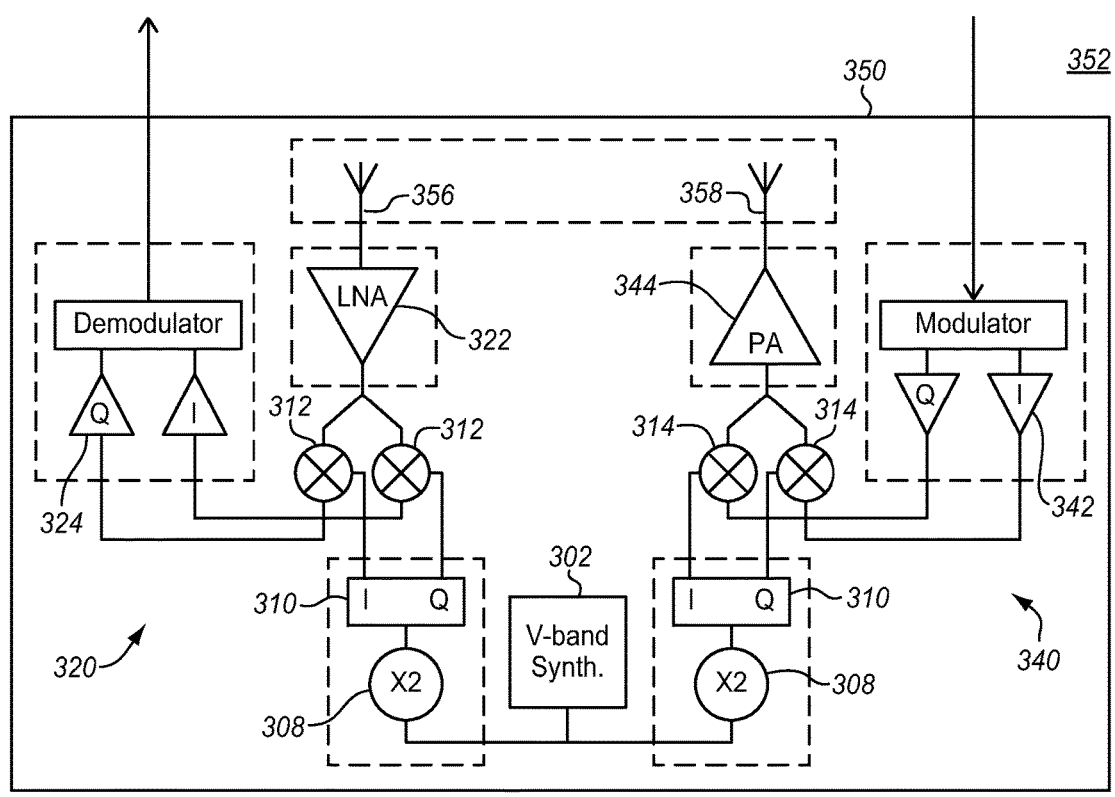
FIG. 3 is a block diagram of a radio chip and related components according to an embodiment.

FIG. 3 is a block diagram of an example of a transceiver or radio chip system architecture and connected components that may be used for the wireless interconnect described herein. The transceiver chip may take a variety of other forms and may include additional functions, depending on the particular implementation. This radio design is provided only as an example. The radio chip 350 is mounted to the package substrate 352 to which the primary integrated circuit die or chip 202, 203 is also mounted as shown in FIG. 1. The substrate 352 is mounted to the PCB or motherboard. The radio package may include a local oscillator (LO) 302 or a connection to an external LO and optionally a switch that allows the external LO feed to be used instead of or in addition to the internal LO. The LO signal may pass an amplifier and multiplier, such as an active doubler 308 and 0/90° quadrature hybrids 310 to drive an upconverter and mixers 314.

The RX (receive) chain 320 may contain a receive antenna 356 in the package coupled to a low noise amplifier (LNA) 322 and a wideband baseband (BB) amplification chain 324 with downconverters 312 for analog to digital conversion. The TX (transmit) chain 340 may include a BB digital driver chain 342 to the upconverters 314, and a power amplifier (PA) 344 to the transmit antenna 358. There may be multiple transmit and receive chains to transmit and receive over multiple channels simultaneously. The various channels may be combined or consolidated in different ways, depending on the particular implementation.

The TX and RX chains are both coupled through the substrate to the antenna. There may be a single antenna for TX and RX or there may be separate RX and TX antennas as shown. The antennas may be designed to have different radiation patterns to suit different wireless connections. In the example of FIG. 2, the first chip's antenna 216 has a wide beam transmit and receive pattern 330. This may allow the chip to communicate with multiple antennas in different locations on the motherboard. The second chip's antenna 218, on the other hand has a narrow beam transmit and receive pattern 332. This allows power to be concentrated in a single direction for communication with just one other device.

Figure 4:
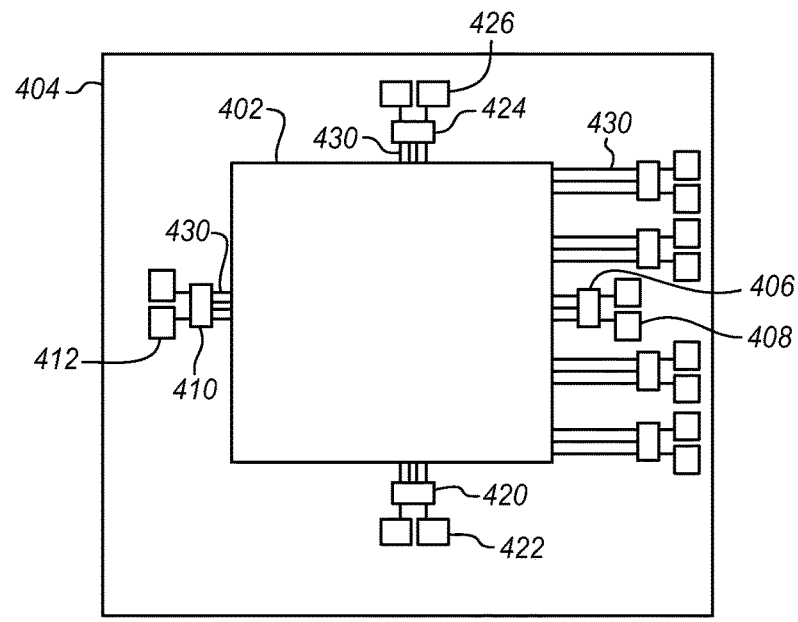
FIG. 4 is a top view diagram of a package with multiple wireless interconnects for chip-to-chip communications according to an embodiment.

FIG. 4 is a top view diagram of an example of an implementation of multiple wireless interconnects on a single microserver package. In this example, separate antennas are used to transmit and receive, but it is also possible to share the antenna between the Tx and the Rx chains. The antenna size may vary from 1.25×1.25 mm or less to 2.5×2.5 mm or more depending on the carrier frequency, desired gain, and transmission range.

A single integrated circuit chip or die 402 includes both processing and baseband systems and is mounted to a package 404. The baseband sections of the chip are coupled through on package traces 430 to radio chips or dies which are in turn coupled through the package to antennas. In this example, the die integrated circuit chip is a CPU for a microserver and is rectangular. There are radio chips on each of the four sides of the CPU. The sides shown as top, left, and bottom in the drawing figure each have a respective radio 424, 410, 420 coupled to a respective Tx, Rx antenna pair 426, 412, 422. The side shown as the right side shows five radios each connected to a respective antenna pair. The number of radios and antennas on each side may be determined based on communication rate needs in each direction.

Very few high speed links may be required on a microserver package. A single link is able to deliver data rates in excess of 40 Gb/s across a distance of a few cm. The data rate may still be on the order of 5-10 Gb/s for transmission distances of up to 50 cm.

FIG. 4 shows many wireless links implemented on the same side of one package. This allows the aggregate data rate to be increased. Alternatively, the data may be sent to different other devices that are in the same general direction. Both the radio chips and the antennas are placed towards the edge of the package to limit obstructions in the radio path that may come from heat sinks and heat spreaders. In general the losses for a copper trace baseband signal are much lower than the losses through the same copper trace for an RF signal. As a result, the radio chips may be kept very close to the antenna. This limits electrical signal and power losses due to the RF routing through the substrate. The radio chip may be installed onto the package in any manner desired and may even be embedded in or a part of the substrate. By using multiple radios, the on-package millimeter-wave wireless interconnects can be scaled for extremely high data rate applications. This may be useful in systems such as servers and media recording, processing, and editing systems. As shown, multiple links can be put together to achieve datarates close to a Tb/s.

Figure 5:
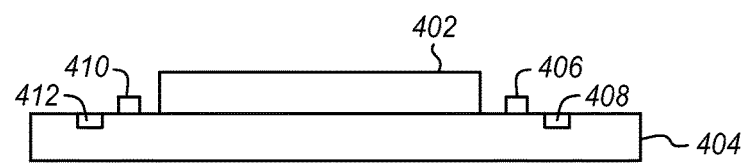
FIG. 5 is a side view diagram of the package of FIG. 4.

FIG. 5 is a cross-sectional side view of the same microserver CPU 402 on a package 404 with radios 406, 410 attached the CPU on opposite sides. These radios are then coupled to respective antennas 408, 412.

Figure 6:
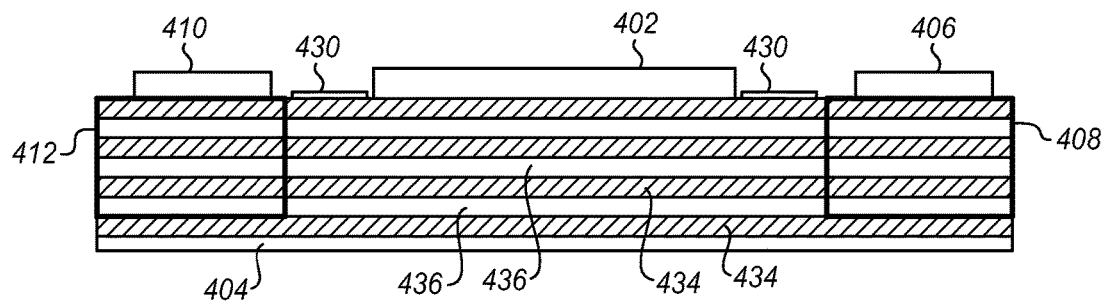
FIG. 6 is a cross-sectional side view diagram of the package of FIG. 4.

FIG. 6 is an alternative side view representation of the cross-sectional side view of FIG. 5. In this representation, the package has multiple layers, such as alternating conductive 430, 434 and dielectric 436 layers for redistribution between the die and the PCB. The package may include routing layers, ground planes and other structures depending on the particular implementation. As suggested in e.g. FIG. 4, the radios may be coupled to different baseband circuits on different sides of the die or they may be coupled very close to each other. As shown in FIGS. 1 and 2, the chip may be coupled to the package substrate using a large number of pads, lands, or balls. These connection pads may be coupled to routing layers that allow baseband connection on one side of the chip to be connected to radios on all sides of the chip. Traces in the routing and redistribution layers may be used to distribute signals from the chip to the radios 406, 410, 420, 424. The traces may be on the top surface of the substrate as suggested by the lines 430 in the diagram of FIG. 4. The traces may also or alternatively be in other layers 434, 436 of the substrate. The traces carrying both baseband and millimeter-wave signals may be controlled impedance lines.

The package substrate may also have vias (not shown) to route the baseband signals between different traces on different layers. Any of a variety of different low cost CPU package substrates may be used including prepreg, FP-4, ABF (Ajiomoto Build-up Film), LCP (Liquid Crystalline Polymer), etc. to accommodate the antenna and signal routing requirements of the illustrated configurations.

The wireless interconnects may each operate at 100-140 GHz using FCCSP (Flip Chip Chip Scale Package) technology or any of a variety of other packaging technologies. A CMOS transceiver die sufficient to power both a transmit and a receive antenna may be made smaller than 1.5×1.5 mm and would not exceed 3×3 mm even if the baseband functionalities of the CPU die were included. Even with multiple radio channels and multiple transmit and receive chains in a single radio die, the size may still be very small. With these frequencies an antenna of about 2.5×2.5 mm is able to provide a data rate of 40 Gb/s or more depending on the modulation and transmission formats across a distance over 50 mm. For such date rates, the antennas may be designed to radiate perpendicularly to the surface of the package. However, other types of antennas may be suitable for other configurations.

The frequency band over 100 GHz is easily accessed with current radio and small antennas. These frequencies are not significantly affected by the switching noise of the CPU and other dies or by other common noise sources inside package and computing systems. In order to provide further noise isolation, a ground plane may be fabricated in the package substrate to isolate various components of the system. The signal may be transmitted using a wide frequency band. In one example, an entire band from 100-140 GHz of 40 GHz is used. A 30 GHz or larger band provides a large data carrying capability or data bandwidth. The particular band and the particular frequencies may be adapted to suit different implementations.

Wired approaches are typically to fixed point-to-point communication. Bulky flex cable connectors interfere with the mechanical and thermal assembly requirements of a computer system. Flex cable connectors also have significant design constraints to ensure reliability and significantly increase the platform Z-height. The wireless interconnect described here, however, only requires that two devices are within radio range of each other. The radios and antennas may be placed on the package in locations that are already available so that the size of the packages is not increased. The connection may also be more reliable because the delicate cable and cable connectors are not used.

Figure 7:
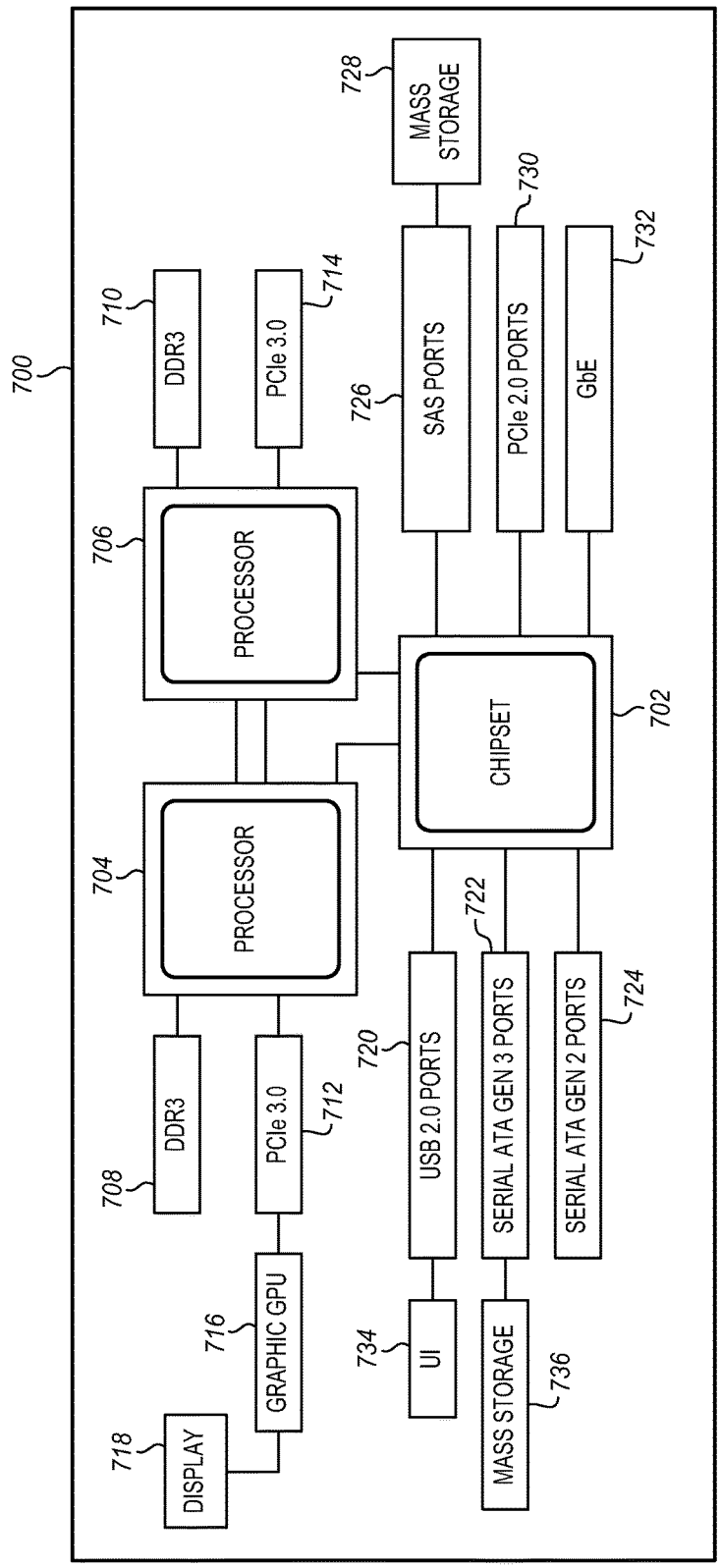
FIG. 7 is block diagram of a computing system with multiple high speed interfaces according to an embodiment.

FIG. 7 is a block diagram of a computing system 700 with multiple high speed interfaces that may be implemented using the wireless connections as described herein. The computing system may be implemented as a server, microserver, workstation, or other computing device. The system has two processors 704, 706 having multiple processing cores although more processors may be used, depending on the particular implementation. The processors are coupled together through a suitable interconnect such as the wireless interconnect described herein. The processors are each coupled to a respective DRAM (Dynamic Random Access Memory) module 708, 710 using a suitable connection, such as the wireless connection described herein. The processors are also each coupled to a PCI (Peripheral Component Interconnect) interface 712, 714. This connection may also be wired or wireless.

The PCI interfaces allow for connections to a variety of high speed additional components such as graphics processors 716 and other high speed I/O systems for display, storage and I/O. The graphics processor drives a display 718. Alternatively, the graphics processor is core or a die within one or both of the processors. The graphics processor may also be coupled to a different interface through a chipset.

The processors are also both coupled to a chipset 702 which provides a single point of contact for many other interfaces and connections. The connection to the chipset may also be wired or wireless, one or both of the processors may be connected to the chipset, depending on the implementation. As shown, a processor 704 may have a wireless connection to one or more processors 706, memory 708, peripheral components 712, and a chipset 702. These connections may all be wireless as suggested by the multiple radio and antennas of FIG. 4. Alternatively, some of these connections may be wired. The processor may have multiple wireless links to the other processor. Similarly the chipset 702 may have wireless connections to one or more of the processors as well as to the various peripheral interfaces as shown.

The chipset is coupled to USB (Universal Serial Bus) interface 720 which may provide ports for connections to a variety of other devices including a user interface 734. The chipset may be connected to SATA (Serial Advanced Technology Attachment) interfaces 722, 724 which may provide ports for mass storage 736 or other devices. The chipset may be connected to other high speed interfaces such as a SAS (Serial Attached Small computer serial interface) interface 726 with ports for additional mass storage 728, additional PCI interfaces 730 and communications interfaces 732, such as Ethernet, or any other desired wired or wireless interface. The described components are all mounted to one or more boards and cards to provide the described connections.

Figure 8:
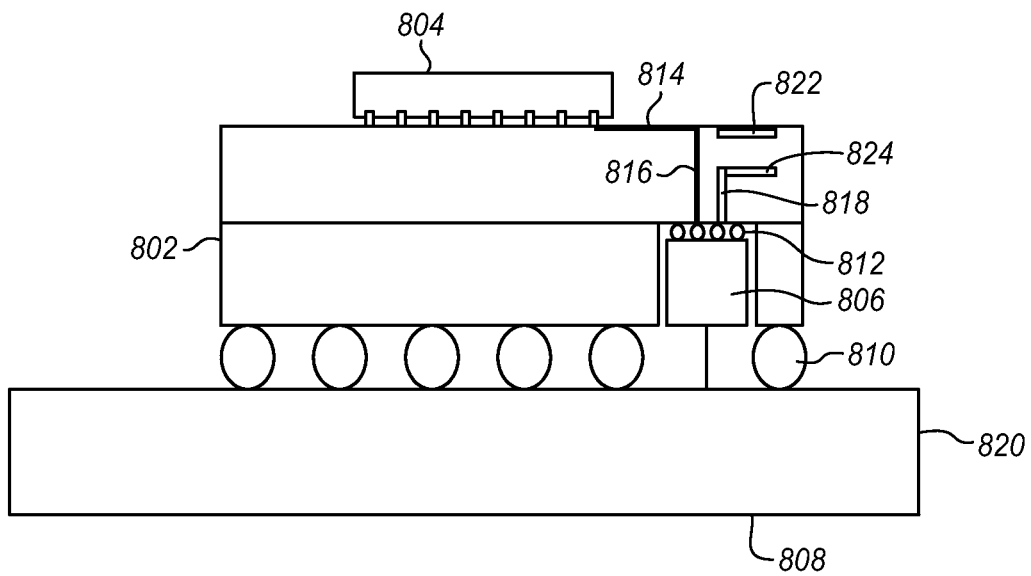
FIG. 8 is a cross-sectional side view diagram of an alternative configuration of a package with a radio transceiver according to an embodiment.

FIG. 8 is a cross-sectional side view diagram of an alternative configuration of a package with an ultra high speed radio transceiver. As compared to the example of FIG. 1, in this example, the radio is placed in a cavity on the bottom of the package substrate instead of being placed on the top. This approach allows the footprint or top surface area of the package to be reduced but may cause the package to be taller.

A package or package substrate 802 has an integrated circuit chip 804 attached to a top side using a solder ball, land grid, pad, or any other suitable connection system. The chip in this or any other example may be a CPU, a memory, an interface or communications hub, or any other integrated circuit or data device. The substrate has a cavity 806 on the opposite side of the substrate. This is shown as the bottom side as compared to the top side which carries the integrated circuit chip. The bottom side includes the solder ball 810 or other type of connection to the system board 820. As in the other examples, the package 802 may connect to a system board through a socket, daughter card or in any of a variety of other ways. A radio 808 is attached to the opposite side of the substrate inside the cavity 806 using a solder ball, land grid, pad or any other suitable connection system.

The top side chip 804 is coupled through a few of its output pads to surface traces 814 on the top side of the substrate 802. These traces connect to vias 816 through the substrate that connect to the connection pads in the cavity to connect the top side chip to the radio 808. The radio may be coupled in another way but the vias provide a quick and direct connection through the package substrate to the radio. The radio then connects again through vias 818 from its connection pads to antennas. In this example, one antenna 822 is on the top side of the substrate and another antenna 824 is embedded within the substrate. The top side antenna may be easier to fabricate while the embedded antenna may provide for a smaller package footprint. All of the antennas may be on the top side of the package or all of the antennas may be embedded into the package or mix may be used as shown here.

Figure 9:
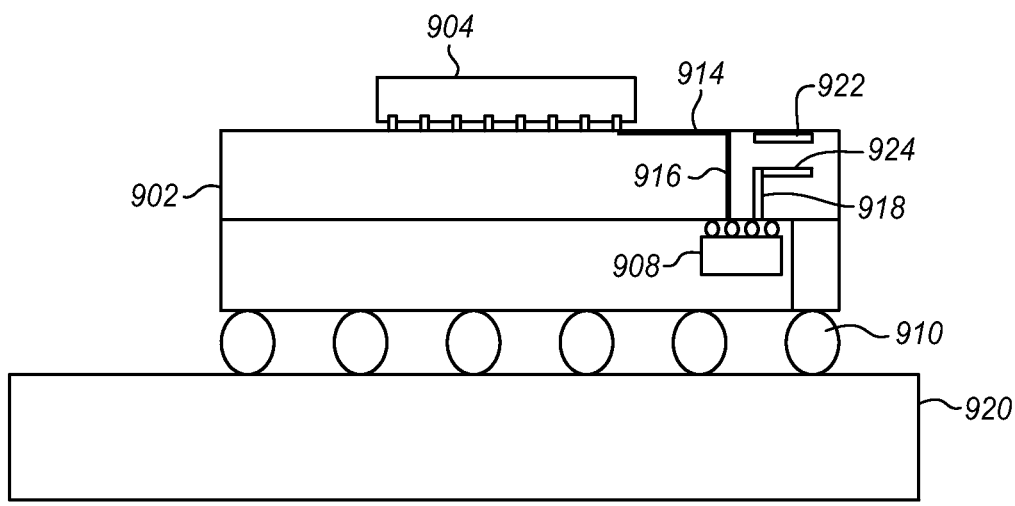
FIG. 9 is a cross-sectional side view diagram of a further alternative configuration of a package with a radio transceiver according to an embodiment.

FIG. 9 is a cross-sectional side view diagram of a further alternative configuration for the package described herein. In this example, the radio is fully embedded within the package substrate. There are a variety of different techniques for embedding a die or discrete analog components within the layers of a substrate. The particular technique may be selected based on the type of substrate and the characteristics of the radio.

In the example of FIG. 9, a package substrate 902 carries an integrated circuit chip 904 attached to a top side. The bottom side is opposite the top side and includes for example, a solder ball grid array 910 to connect directly to the system board 920 or through some interposer, socket, or other device. A radio 908 is embedded within the substrate and attached using solder balls, or in any other desired way. The top side chip 904 connects to the radio using surface traces 914 on the top side of the substrate 902 that connect through vias 916 to the radio. The radio is connected through a second set of vias 918 to surface 922 or embedded 924 antennas.

Figure 10:
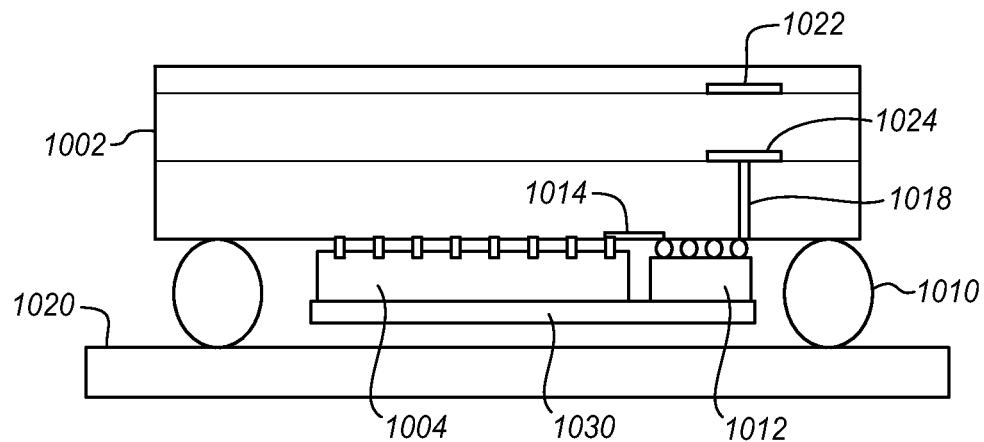
FIG. 10 is a cross-sectional side view diagram of another alternative configuration of a package with a radio transceiver according to an embodiment.

FIG. 10 shows another alternative in which both the primary integrated circuit chip and the radio die are both on the bottom of the substrate. The antenna is on the top of the substrate or embedded into the substrate. This configuration is well-suited for lower power primary chips because cooling may be limited underneath the substrate. This configuration is also well-suited for stacked die systems. Additional dies (not shown) may be stacked over the top side of the substrate to add additional functions or processing power to the package.

In this example a package substrate 1002 is coupled to a system board 1020 on a bottom side using a ball grid array 1010 or other attachment mechanism. A primary integrated circuit chip 1030 and a radio chip 1012 are also attached to the bottom side of the substrate. The two chips are connected with a trace 1014 on the bottom side of the package. The radio is then connected to antennas 1022, 1024 with vias 1018 through the substrate to the top side or to an embedded antenna. In this configuration with the integrated circuit and the radio side-by-side an optional heat spreader 1030 may be attached to the both dies to help conduct heat away from the dies to the ambient or to a cooling system (not shown).

Figure 11:
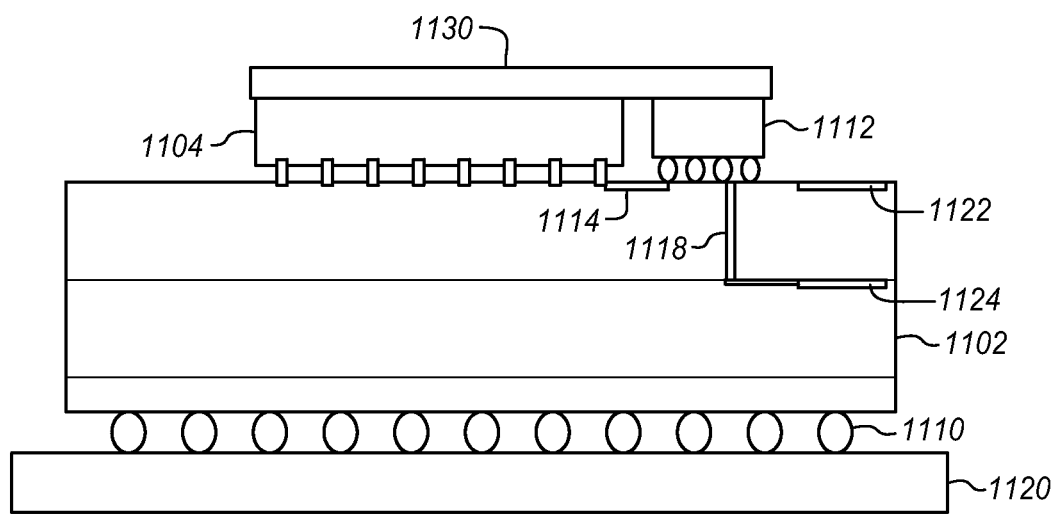
FIG. 11 is a cross-sectional side view diagram of another alternative configuration of a package with a radio transceiver according to an embodiment.

FIG. 11 shows another variation in which the primary and radio dies are both attached to the top side of the substrate. A package substrate 1102 is coupled to a system board 1120 on a bottom side using a ball grid array 1110 or similar A primary integrated circuit chip 1130 and a radio chip 1112 are instead both attached to the top side of the substrate opposite the system board. The two chips are connected to each other with a trace 1114 on the top side as in the example of FIG. 1. The radio is then connected to the antennas. A top side antenna 1122 may be connected to the radio using a trace on the top of the substrate. An embedded antenna 1124 may be connected using a via 1118 through the substrate to the embedded antenna. This connection may include horizontal lines across the top of the substrate or across any desired embedded layer or a combination of multiple horizontal and vertical sections. There is also a heat spreader 1130 attached across both dies.

In this example as in several other examples there are two different antennas coupled to the radio. Each antenna may be the same or different. If the antennas have different radiation patterns, then they may be used to communicate to a different device. Alternatively, one may be for receive and the other for transmit. One may be for low data rates and the other for higher data rates. Alternatively, the two antennas may be combined in order to provide double the total data rate. In each of these examples, only two chips are shown attached to the package, however, there may more radios as shown in the example of FIG. 4. There may also be other types of chips to provide additional functions.

Figure 12:
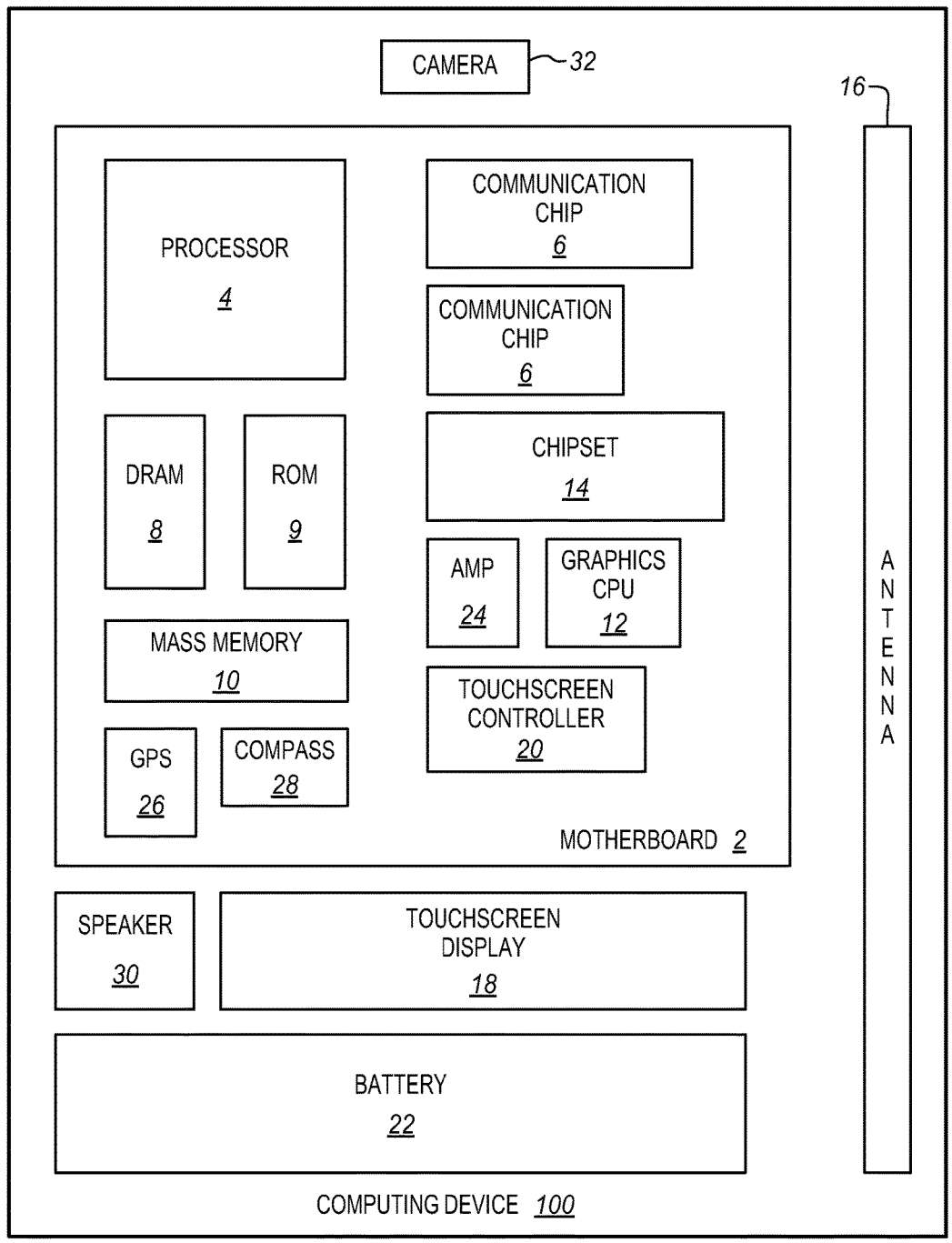
FIG. 12 is a block diagram of a computing device incorporating wireless interfaces according to an embodiment.

FIG. 12 illustrates a computing device 100 in accordance with another implementation. The computing device 100 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 11 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 11. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

In some implementations, any one or more of the components may be adapted to use the wireless connection described herein. The features of the system of FIG. 12 may be adapted to that of FIG. 7 and vice versa. For example, the system of FIG. 12 may carry multiple processors. The system of FIG. 7 may include any one or more of the peripherals shown in FIG. 12. The term "processor" may refer to any device or portion of a device that processes electronic data from registers and/or memory to transform that electronic data into other electronic data that may be stored in registers and/or memory.

In various implementations, the computing device 11 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 11 may be any other electronic device that processes data including a wearable device.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes an integrated circuit chip, a package substrate to carry the integrated circuit chip, the package substrate having conductive connectors to connect the integrated circuit chip to external components, a radio coupled to the integrated circuit chip to receive data from the integrated circuit chip and to modulate the data onto a radio frequency carrier, and an antenna on the package substrate coupled to the radio to send the modulated data over the carrier to an external device.

In further embodiments the radio is formed in a radio chip on the package substrate coupled to the integrated circuit chip through the package substrate.

In further embodiments the radio includes a transmit chain coupled to the antenna and a receive chain coupled to the antenna and wherein the antenna is also to receive data from the external device.

In further embodiments the radio includes a transmit chain coupled to the antenna and a receive chain, the apparatus further comprising a receive antenna coupled to the receive chain to receive data from the external device.

In further embodiments the radio frequency carrier is a millimeter wave carrier.

In further embodiments the package substrate is rectangular and the antenna is on a side of the package substrate, the apparatus further comprising at least one additional radio and antenna on the package substrate to send additional modulated data over the carrier.

Further embodiments include at least one additional radio and antenna on a second side of the package substrate to send additional modulated data over the carrier in a different direction.

In further embodiments the radio comprises a plurality of transmit chains to transmit a plurality of data stream over a plurality of different radio frequency carriers through the antenna.

In further embodiments the integrated circuit chip and the radio are mounted to a same surface of the substrate and wherein the radio is coupled to the integrated circuit chip using traces on the same surface of the substrate.

In further embodiments the antenna is embedded into the package substrate and wherein the antenna is coupled to the radio using a vertical via through the package.

Some embodiments pertain to an apparatus that includes an integrated circuit chip, a package substrate to carry the integrated circuit chip, the package substrate having conductive connectors to connect the integrated circuit chip to external components wherein the integrated circuit chip is mounted to a first surface of the substrate, a radio coupled to the integrated circuit chip to receive data from the integrated circuit chip and to modulate the data onto a radio frequency carrier wherein the radio is mounted to a second surface of the substrate opposite the first surface and coupled to the integrated circuit chip using vertical vias through the substrate, and an antenna on the package substrate coupled to the radio to send the modulated data over the carrier to an external device.

In further embodiments the antenna is coupled to the radio using vertical vias through the substrate.

In further embodiments the substrate comprises a cavity in the second surface and wherein the radio is mounted within the cavity.

In further embodiments the antenna is embedded in the substrate and wherein the antenna is coupled to the substrate through a vertical via.

Some embodiments pertain to a computing system that includes a system board and a plurality of integrated circuit chip packages coupled to the system board, each integrated circuit package having an integrated circuit chip, a package substrate to carry the integrated circuit chip, the package substrate having conductive connectors to connect the integrated circuit chip to the system board, a radio coupled to the integrated circuit chip to receive data from the integrated circuit chip and modulate the data onto a radio frequency carrier, and an antenna on the package substrate coupled to the radio to send the modulated data over the carrier to another one of the integrated circuit chip packages.

In further embodiments the radio is formed in a radio chip on the package substrate coupled to the integrated circuit chip through the package substrate.

In further embodiments the radio includes a receive chain, the apparatus further comprising a receive antenna coupled to the receive chain to receive data from the external device.

In further embodiments the package substrate is rectangular and the antenna is on a side of the package substrate, the apparatus further comprising at least one additional radio and antenna on the package substrate to send additional modulated data over the carrier.

In further embodiments the integrated circuit chip and the radio are mounted to a same surface of the substrate and wherein the radio is coupled to the integrated circuit chip using traces on the same surface of the substrate.

In further embodiments the antenna is embedded into the package substrate and wherein the antenna is coupled to the radio using a vertical via through the package.

The invention claimed is:

1. An apparatus comprising:
an integrated circuit chip;
a package substrate to carry the integrated circuit chip, the package substrate having conductive connectors to connect the integrated circuit chip to external components;
a radio coupled to the integrated circuit chip to receive data from the integrated circuit chip and to modulate the data onto a radio frequency carrier, wherein the radio is formed in a radio chip on the package substrate coupled to the integrated circuit chip through the package substrate; and
an antenna on the package substrate coupled to the radio to send the modulated data over the carrier to an external device.

2. The apparatus of claim 1, wherein the radio includes a transmit chain coupled to the antenna and a receive chain coupled to the antenna and wherein the antenna is also to receive data from the external device.

3. The apparatus of claim 1, wherein the radio includes a transmit chain coupled to the antenna and a receive chain, the apparatus further comprising a receive antenna coupled to the receive chain to receive data from the external device.

4. The apparatus of claim 1, wherein the radio frequency carrier is a millimeter wave carrier.

5. The apparatus of claim 1, wherein the package substrate is rectangular and the antenna is on a side of the package substrate, the apparatus further comprising at least one additional radio and antenna on the package substrate to send additional modulated data over the carrier.

6. The apparatus of claim 5, further comprising at least one additional radio and antenna on a second side of the package substrate to send additional modulated data over the carrier in a different direction.

7. The apparatus of claim 1, wherein the radio comprises a plurality of transmit chains to transmit a plurality of data stream over a plurality of different radio frequency carriers through the antenna.

8. The apparatus of claim 1, wherein the integrated circuit chip and the radio are mounted to a same surface of the substrate and wherein the radio is coupled to the integrated circuit chip using traces on the same surface of the substrate.

9. The apparatus of claim 8, wherein the antenna is embedded into the package substrate and wherein the antenna is coupled to the radio using a vertical via through the package.

10. An apparatus comprising:
an integrated circuit chip;
a package substrate to carry the integrated circuit chip, the package substrate having conductive connectors to connect the integrated circuit chip to external components wherein the integrated circuit chip is mounted to a first surface of the substrate;
a radio coupled to the integrated circuit chip to receive data from the integrated circuit chip and to modulate the data onto a radio frequency carrier wherein the radio is mounted to a second surface of the substrate opposite the first surface and coupled to the integrated circuit chip using vertical vias through the substrate; and
an antenna on the package substrate coupled to the radio to send the modulated data over the carrier to an external device.

11. The apparatus of claim 10, wherein the antenna is coupled to the radio using vertical vias through the substrate.

12. The apparatus of claim 10, wherein the substrate comprises a cavity in the second surface and wherein the radio is mounted within the cavity.

13. The apparatus of claim 10, wherein the antenna is embedded in the substrate and wherein the antenna is coupled to the substrate through a vertical via.

14. A computing system comprising:
a system board; and a plurality of integrated circuit chip packages coupled to the system board, each integrated circuit package having an integrated circuit chip, a package substrate to carry the integrated circuit chip, the package substrate having conductive connectors to connect the integrated circuit chip to the system board, a radio coupled to the integrated circuit chip to receive data from the integrated circuit chip and modulate the data onto a radio frequency carrier, wherein the radio is formed in a radio chip on the package substrate coupled to the integrated circuit chip through the package substrate, and an antenna on the package substrate coupled to the radio to send the modulated data over the carrier to another one of the integrated circuit chip packages.

15. The computing system of claim 14, wherein the radio includes a receive chain, the apparatus further comprising a receive antenna coupled to the receive chain to receive data from the external device.

16. The computing system of claim 14, wherein the package substrate is rectangular and the antenna is on a side of the package substrate, the apparatus further comprising at least one additional radio and antenna on the package substrate to send additional modulated data over the carrier.

17. The computing system of claim 14, wherein the integrated circuit chip and the radio are mounted to a same surface of the substrate and wherein the radio is coupled to the integrated circuit chip using traces on the same surface of the substrate.

18. The computing system of claim 17, wherein the antenna is embedded into the package substrate and wherein the antenna is coupled to the radio using a vertical via through the package.

* * * * *